(12) United States Patent
Cheng et al.

(10) Patent No.: US 12,356,649 B2
(45) Date of Patent: Jul. 8, 2025

(54) SEMICONDUCTOR STRUCTURE AND METHOD FOR MANUFACTURING THE SAME

(71) Applicant: ENKRIS SEMICONDUCTOR, INC., Suzhou (CN)

(72) Inventors: Kai Cheng, Suzhou (CN); Yu Zhu, Nantong (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 410 days.

(21) Appl. No.: 17/465,690

(22) Filed: Sep. 2, 2021

(65) Prior Publication Data

US 2021/0399122 A1  Dec. 23, 2021

Related U.S. Application Data

(63) Continuation of application No. PCT/CN2019/091545, filed on Jun. 17, 2019.

(51) Int. Cl.
  H10D 30/47 (2025.01)
  H10D 30/01 (2025.01)
  (Continued)

(52) U.S. Cl.
  CPC ......... H10D 30/475 (2025.01); H10D 30/015 (2025.01); H10D 62/824 (2025.01); H10D 62/8503 (2025.01); H10D 64/311 (2025.01)

(58) Field of Classification Search
  CPC .. H10D 30/475; H10D 30/015; H10D 62/824; H10D 62/8503; H10D 64/311;
  (Continued)

(56) References Cited

U.S. PATENT DOCUMENTS

| 10,566,192 B2 * | 2/2020 | Lu ........................ H10D 62/299 |
| 2003/0219933 A1 * | 11/2003 | Yamauchi ............ H10D 30/664 438/156 |

(Continued)

FOREIGN PATENT DOCUMENTS

| CN | 102386223 A | 3/2012 |
| CN | 102856374 A | 1/2013 |

(Continued)

OTHER PUBLICATIONS

Machine Translation of JP-2017073526-A (Year: 2017).*
(Continued)

*Primary Examiner* — Yara B Green
*Assistant Examiner* — Akhee Sarker-Nag
(74) *Attorney, Agent, or Firm* — Westbridge IP LLC

(57) ABSTRACT

The present application provides a semiconductor structure and a method for manufacturing the same, which solves a problem that an existing semiconductor structure is difficult to deplete a carrier concentration of a channel under a gate to realize an enhancement mode device. The semiconductor structure includes: a channel layer and a barrier layer superimposed in sequence, wherein a gate region is defined on a surface of the barrier layer; a plurality of trenches formed in the gate region, wherein the plurality of trenches extend into the channel layer; and a P-type semiconductor material filling the plurality of trenches.

20 Claims, 22 Drawing Sheets

(51) Int. Cl.
*H10D 62/10* (2025.01)
*H10D 62/17* (2025.01)
*H10D 62/824* (2025.01)
*H10D 62/85* (2025.01)
*H10D 64/27* (2025.01)

(58) Field of Classification Search
CPC .. H10D 62/343; H10D 64/411; H10D 64/513; H10D 64/514; H10D 64/519; H10D 62/114; H10D 62/107; H01L 29/7786; H01L 29/2003; H01L 29/205; H01L 29/42312; H01L 29/66462; H01L 29/0646; H01L 29/0623; H01L 29/1066; H01L 29/42316; H01L 29/4236; H01L 29/42364; H01L 29/4238
See application file for complete search history.

(56) References Cited

U.S. PATENT DOCUMENTS

| | | | | |
|---|---|---|---|---|
| 2008/0203455 | A1* | 8/2008 | Jang | H10D 64/513 257/E21.177 |
| 2010/0025730 | A1* | 2/2010 | Heikman | H10D 30/4755 257/E21.403 |
| 2013/0313612 | A1 | 11/2013 | Khalil et al. | |
| 2017/0345921 | A1 | 11/2017 | Feng | |
| 2018/0053835 | A1* | 2/2018 | Balakrishnan | H10D 62/292 |
| 2018/0219086 | A1* | 8/2018 | Higuchi | H10D 64/117 |
| 2019/0288101 | A1* | 9/2019 | Longobardi | H01L 29/7788 |

FOREIGN PATENT DOCUMENTS

| | | | |
|---|---|---|---|
| CN | 103872121 A | | 6/2014 |
| CN | 105845723 A | | 8/2016 |
| CN | 106024880 A | | 10/2016 |
| CN | 106898640 A | | 6/2017 |
| CN | 107958928 A | | 4/2018 |
| CN | 109817712 A | | 5/2019 |
| JP | 2009212291 A | | 9/2009 |
| JP | 2017073526 A | * | 4/2017 |
| KR | 20140016105 A | | 2/2014 |
| KR | 20150091705 A | | 8/2015 |
| KR | 101559753 B1 | | 10/2015 |

OTHER PUBLICATIONS

JP_2017073526_A_I-FIT English (Year: 2017).*
JP 2017073526 A_English Translation (Year: 2017).*
JP 2017073526 A (Year: 2017).*
International Search Report issued in corresponding PCT Application No. PCT/CN2019/091545, dated Mar. 6, 2020.
Written Opinion issued in corresponding PCT Application No. PCT/CN2019/091545, dated Mar. 6, 2020.
Second Office Action issued in counterpart Chinese Patent Application No. 201980097400.X, dated Apr. 20, 2024.

* cited by examiner

SEMICONDUCTOR STRUCTURE AND METHOD FOR MANUFACTURING THE SAME

CROSS-REFERENCE TO RELATED APPLICATIONS

The present application is a continuation application of International Application No. PCT/CN2019/091545 filed on Jun. 17, 2019. The application is incorporated herein by reference in its entireties.

TECHNICAL FIELD

The present application relates to the field of microelectronic technologies, in particular to a semiconductor structure and a method for manufacturing the same.

BACKGROUND

High Electron Mobility Transistor (HEMT) is a heterojunction field effect transistor. Taking AlGaN/GaN heterostructure as an example, due to a strong two-dimensional electron gas in the AlGaN/GaN heterostructure, the AlGaN/GaN HEMT is usually a depletion mode device, which makes it difficult to implement an enhancement mode device. In many places, the application of depletion mode devices has certain limitations. For example, in the application of power switching devices, enhancement mode (normally-off) switching devices are required. Enhancement mode GaN switching devices are mainly used in high-frequency devices, power switching devices and digital circuits, and its research is of great significance. In order to realize enhancement mode GaN switching devices, it is necessary to find a suitable method to reduce a carrier concentration of a channel under a gate at zero gate voltage. Therefore, how to reduce the carrier concentration of the channel under the gate at zero gate voltage has become a research hotspot in this field.

SUMMARY

In view of this, the present application provides a semiconductor structure and a method for manufacturing the same, which solves a problem that an existing semiconductor structure is difficult to deplete a carrier concentration of a channel under a gate to realize an enhancement mode device.

An embodiment of the present application provides a semiconductor structure, including:

a channel layer and a barrier layer superimposed in sequence;

a plurality of trenches formed in a gate region of the barrier layer, wherein the plurality of trenches extend into the channel layer; and a P-type semiconductor material filling the plurality of trenches.

In another embodiment of the present application, a material of the channel layer of the semiconductor structure includes GaN, and a material of the barrier layer includes AlGaN.

In another embodiment of the present application, the P-type semiconductor material of the semiconductor structure includes P-type GaN or P-type InGaN.

In another embodiment of the present application, the semiconductor structure further includes: a dielectric layer superimposed on a surface of the barrier layer, wherein the dielectric layer covers the barrier layer.

In another embodiment of the present application, a material of the dielectric layer of the semiconductor structure includes one or a combination of following materials: $SiO_2$ and SiN.

In another embodiment of the present application, the semiconductor structure further includes: a gate electrode located in a gate region above the barrier layer, a source electrode located in a source region above the barrier layer and a drain electrode located in a drain region above the barrier layer.

In another embodiment of the present application, the semiconductor structure further includes: a nucleation layer and a buffer layer, located between a substrate and the channel layer.

Another embodiment of the present application provides a method for manufacturing a semiconductor structure, including:

preparing a channel layer and a barrier layer superimposed in sequence;

preparing a plurality of trenches extending into the channel layer in a gate region of the barrier layer; and filling the plurality of trenches with a P-type semiconductor material respectively.

In another embodiment of the present application, the method for manufacturing a semiconductor structure further includes: preparing a dielectric layer on a surface of the barrier layer, wherein the dielectric layer covers the barrier layer.

In another embodiment of the present application, the method for manufacturing a semiconductor structure further includes: preparing a gate electrode in a gate region above the barrier layer, a source electrode in a source region above the barrier layer and a drain electrode in a drain region above the barrier layer.

According to the semiconductor structure and the method for manufacturing the same provided by the embodiments of the present application, a two-dimensional electron gas between the channel layer and the barrier layer may be depleted by being filled with the P-type semiconductor material, thereby realizing an enhancement mode device.

DETAILED DESCRIPTION OF THE EMBODIMENTS

The technical schemes of the present application will be described in detail below in combination with specific embodiments shown in the accompanying drawings. However, it cannot consider that these embodiments constitute a limitation to the scope of the present application. It should be noted that, and all these structural, method, or functional changes made by those of ordinary skill in the art according to these embodiments fall into the protection scope of the present application.

In addition, repeated reference numbers or labels may be used in different embodiments. These repetitions are only to describe the present application simply and clearly, and do not represent any correlation between the different embodiments and/or structures discussed.

Figure 14:
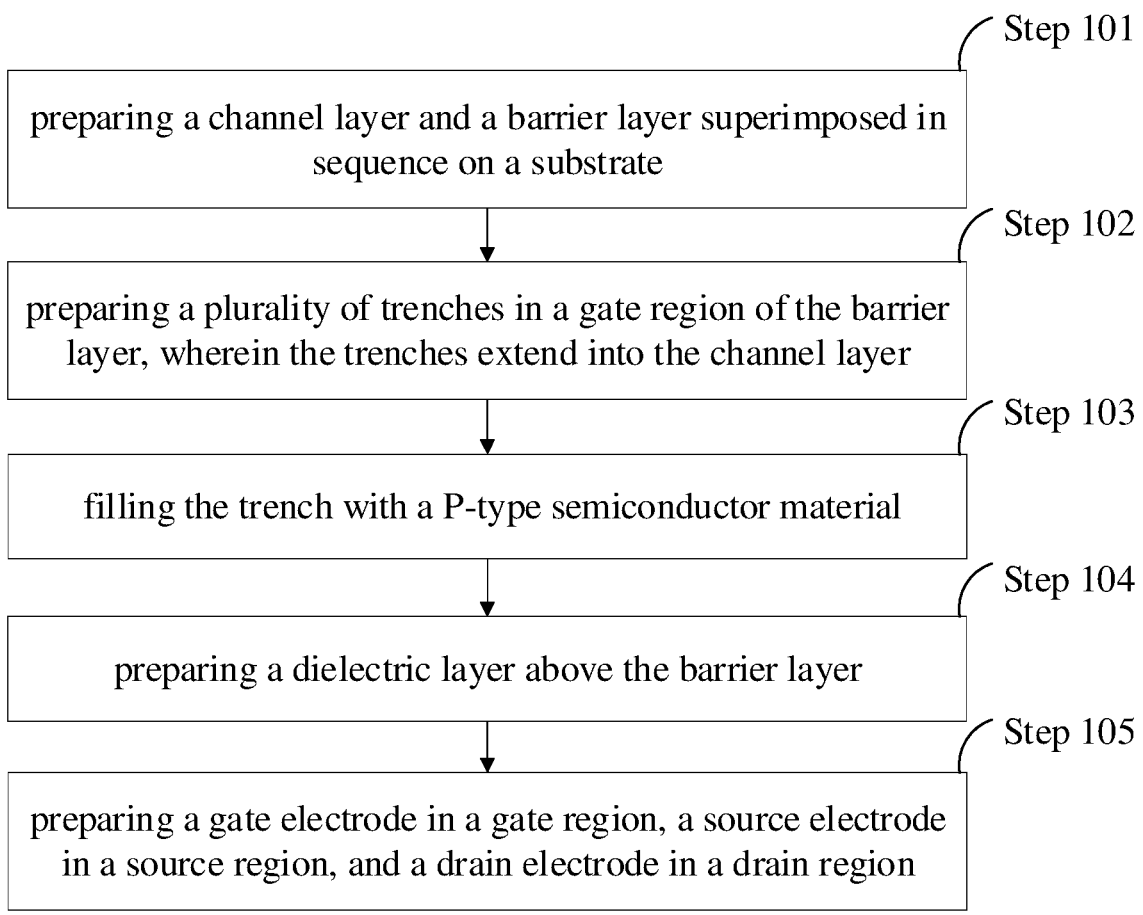
FIG. 14 is a schematic flowchart illustrating a method for manufacturing a semiconductor structure according to an embodiment of the present application.

An embodiment of the present application provides a method for manufacturing a semiconductor structure. As shown in FIG. 14, the method for manufacturing a semiconductor structure includes following contents.

Figure 1A:
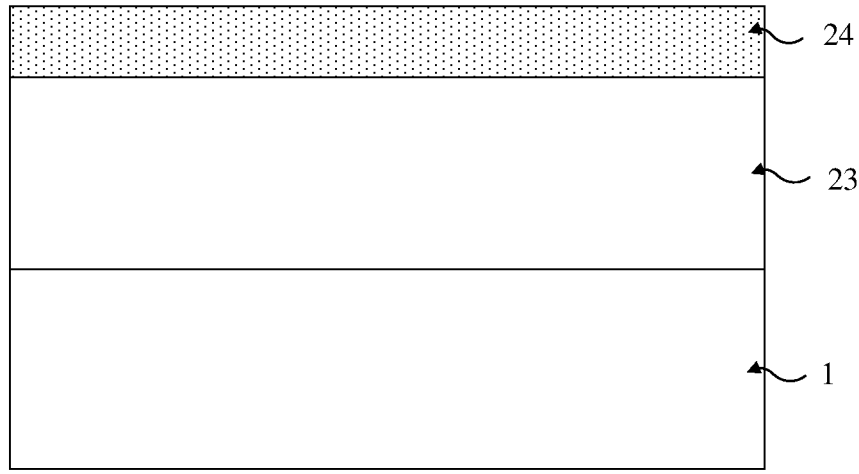
FIGS. 1a-1c, 2a-2e, 3a-3b, 4a-4b, 5a-5b, 6a-6e, 7a-7d, 8a-8c, 9a-9c, 10a-10c, 11a-11c, 12a-12d and 13a-13d are schematic diagrams of a semiconductor structure provided by an embodiment of the present application during a manufacturing process respectively.

Step 101: as shown in FIG. 1a, a channel layer 23 and a barrier layer 24 superimposed in sequence are prepared on a substrate 1.

The substrate 1 may be selected from semiconductor materials, ceramic materials, or polymer materials. For example, the substrate 1 is preferably selected from diamond, sapphire, silicon carbide, silicon, lithium niobate, silicon on insulator (SOI), gallium nitride, or aluminum nitride.

The channel layer 23 and the barrier layer 24 may be heterojunction semiconductor materials capable of forming two-dimensional electron gas. For example, taking a GaN-based material as an example, the channel layer 23 may be GaN, and the barrier layer 24 may be AlGaN. Due to the piezoelectric polarization effect, the channel layer 23 and the barrier layer 24 constitute a heterostructure to form a two-dimensional electron gas.

Figure 1B:
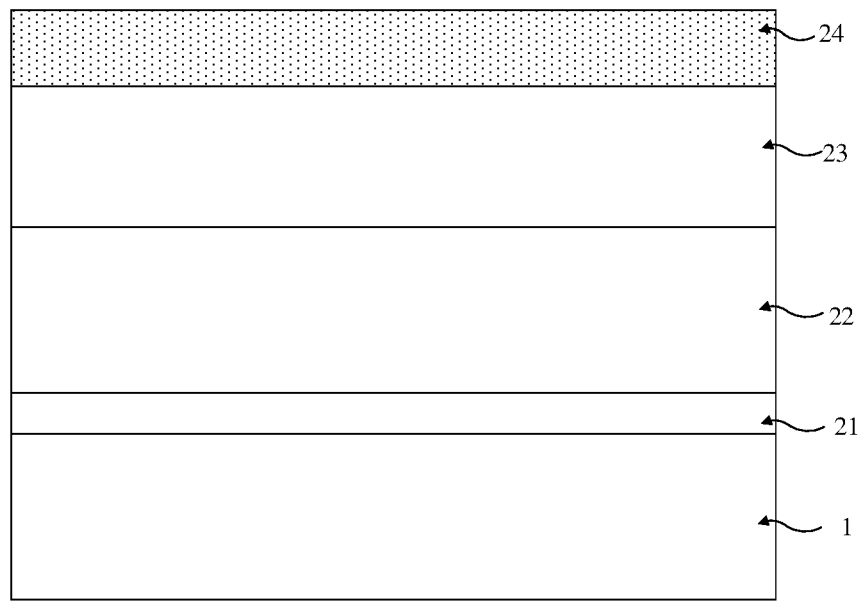

In an embodiment of the present application, as shown in FIG. 1b, before the channel layer 23 is grown, a nucleation layer 21 and a buffer layer 22 may be grown on the substrate 1 in sequence. Taking a GaN-based semiconductor structure as an example, the nucleation layer 21 can reduce dislocation density and defect density, and improve crystal quality. The nucleation layer 21 may be one or more of AlN, AlGaN, and GaN. The buffer layer 22 can buffer the stress in an epitaxial structure above the substrate and prevent the epitaxial structure from cracking. The buffer layer 22 may include one or more of AlN, GaN, AlGaN, and AlInGaN.

Figure 1C:
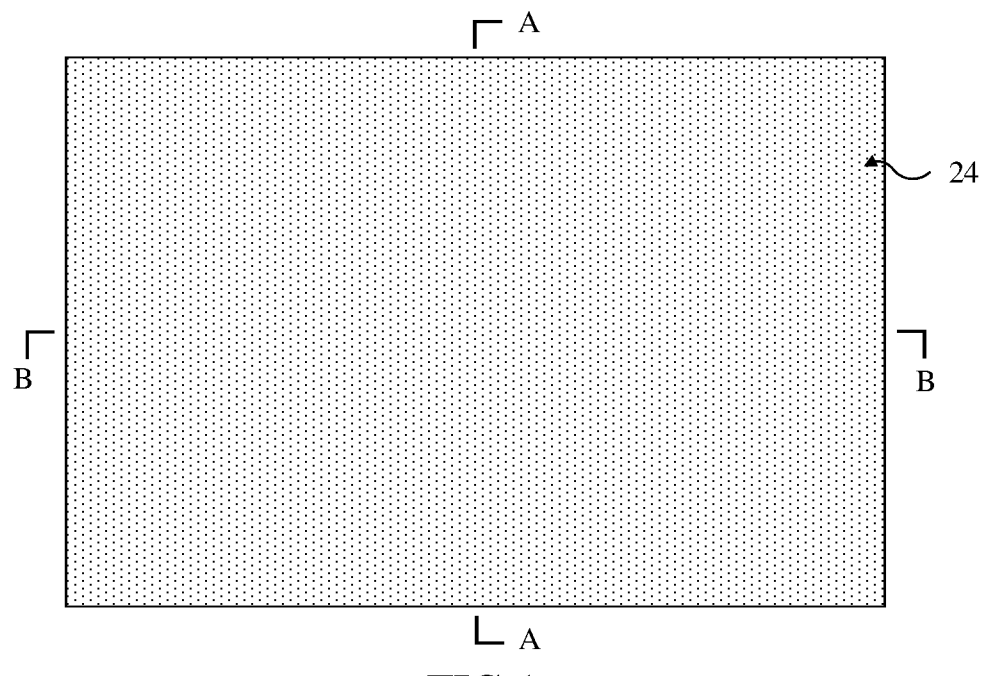

FIG. 1c is a top view of the semiconductor structure shown in FIG. 1a, and FIG. 1a is a cross-sectional view of the semiconductor structure shown in FIG. 1c along the B-B section line.

Step 102: a plurality of trenches 3 are prepared in a gate region of the barrier layer 24, and the trenches extend into the channel layer 23.

Figure 2A:
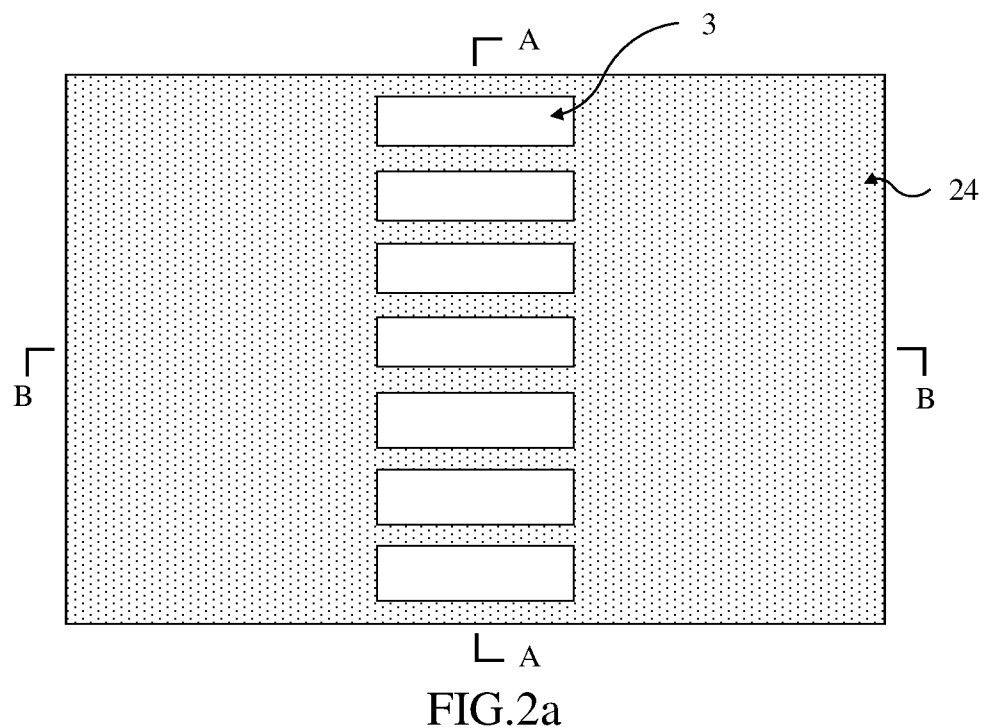
Figure 2B:
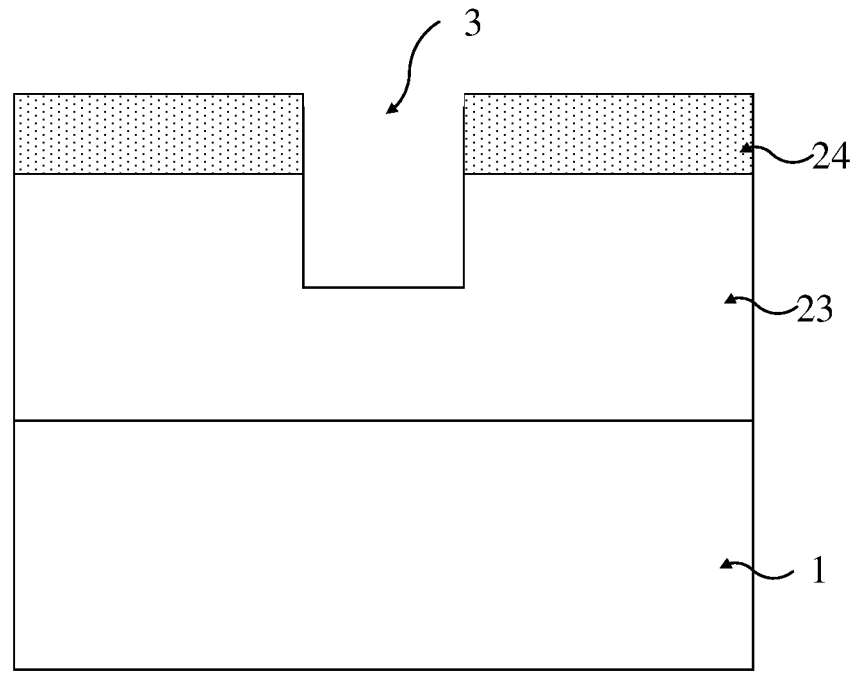
Figure 2C:
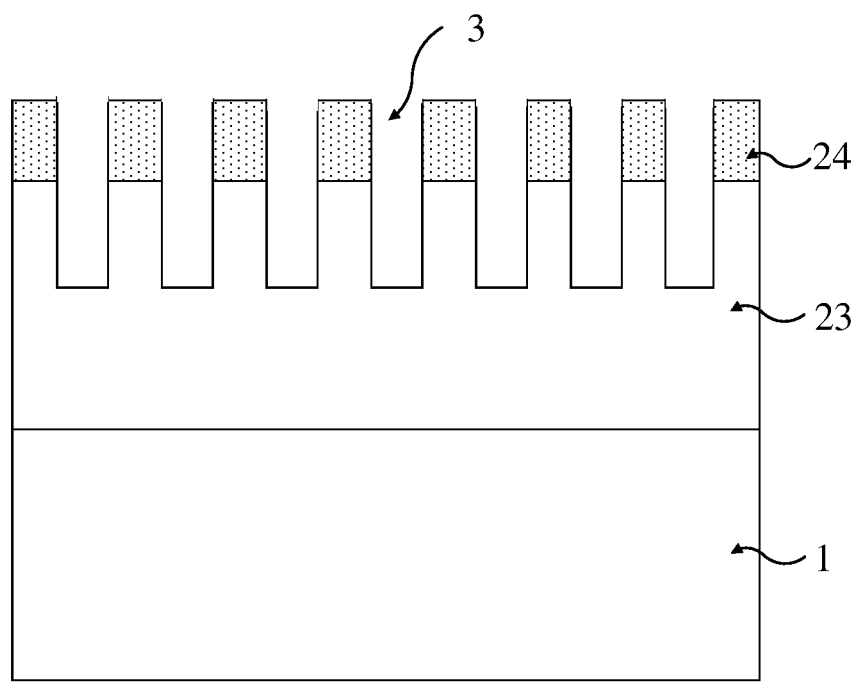

As shown in FIGS. 2a-2c, FIG. 2a is a top view of FIGS. 2b and 2c, FIG. 2b is a cross-sectional view of FIG. 2a along the B-B section line, and FIG. 2c is a cross-sectional view of FIG. 2a along the A-A section line.

The gate region in the present application is a region used to prepare a gate. A person of ordinary skill in the art should understand that the gate region can be defined and determined according to design requirements of related devices.

FIG. 2b is a cross-sectional view of the semiconductor structure shown in FIG. 2a along the B-B section line, and FIG. 2c is a cross-sectional view of the semiconductor structure shown in FIG. 2a along the A-A section line.

Figure 3A:
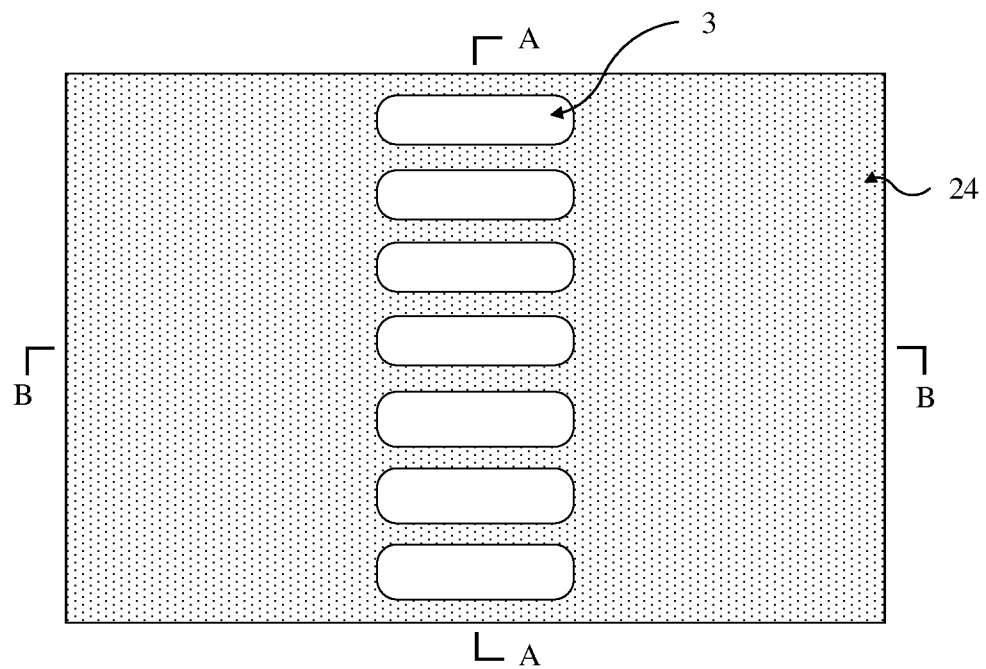
Figure 3B:
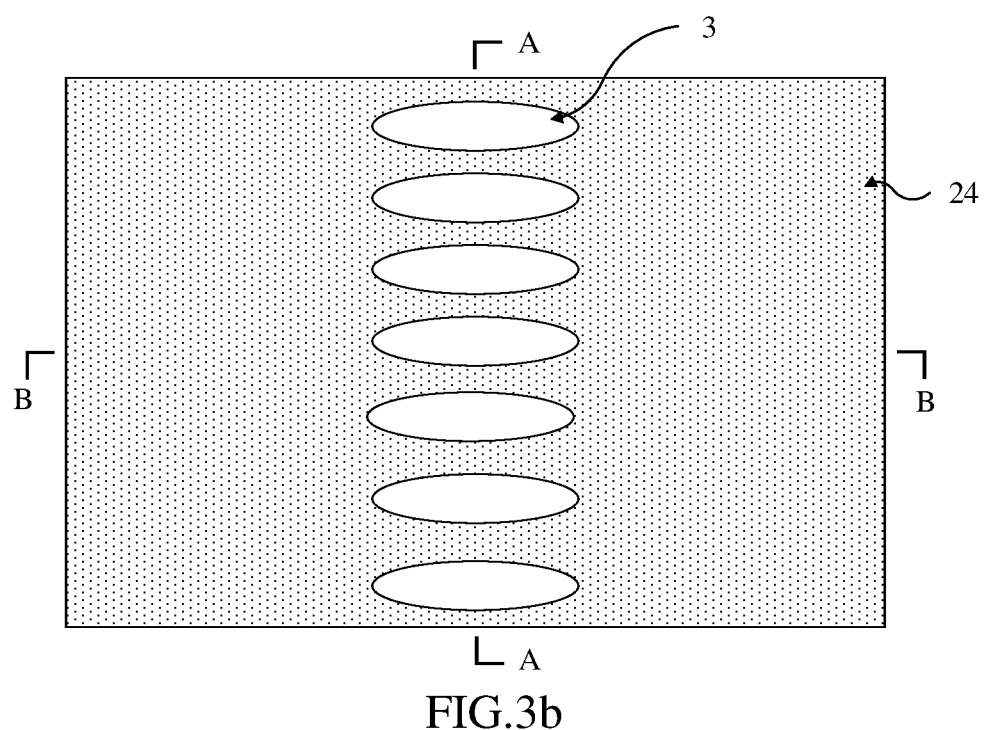

In the embodiment shown in FIG. 2a, a shape of the trench 3 viewing from top to bottom is rectangular, but the shape of the trench 3 viewing from top to bottom is not particularly limited in the present application. As shown in FIGS. 3a and 3b, the shape of the trench 3 viewing from top to bottom may be designed according to specific design requirements.

Figure 4A:
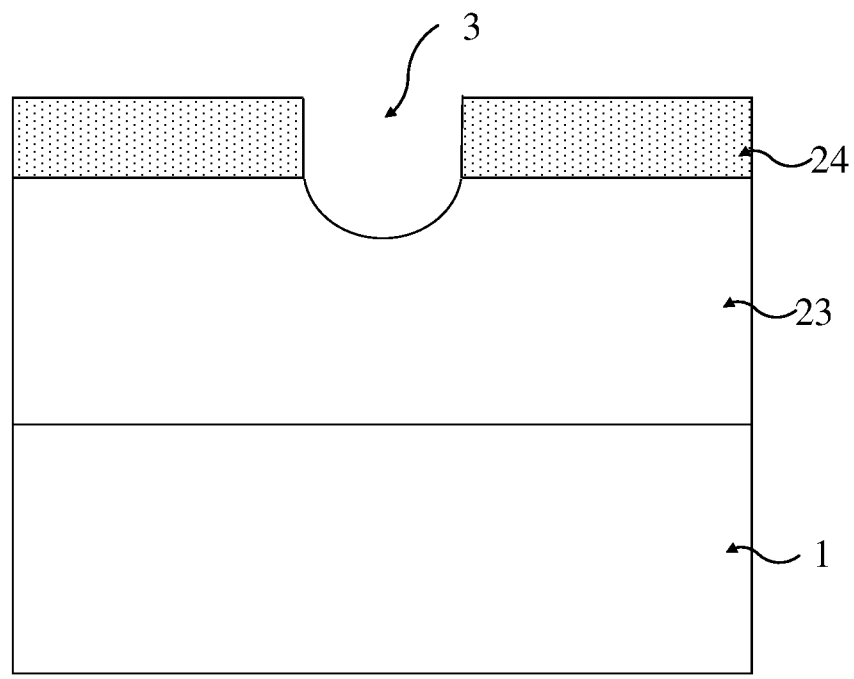
Figure 4B:
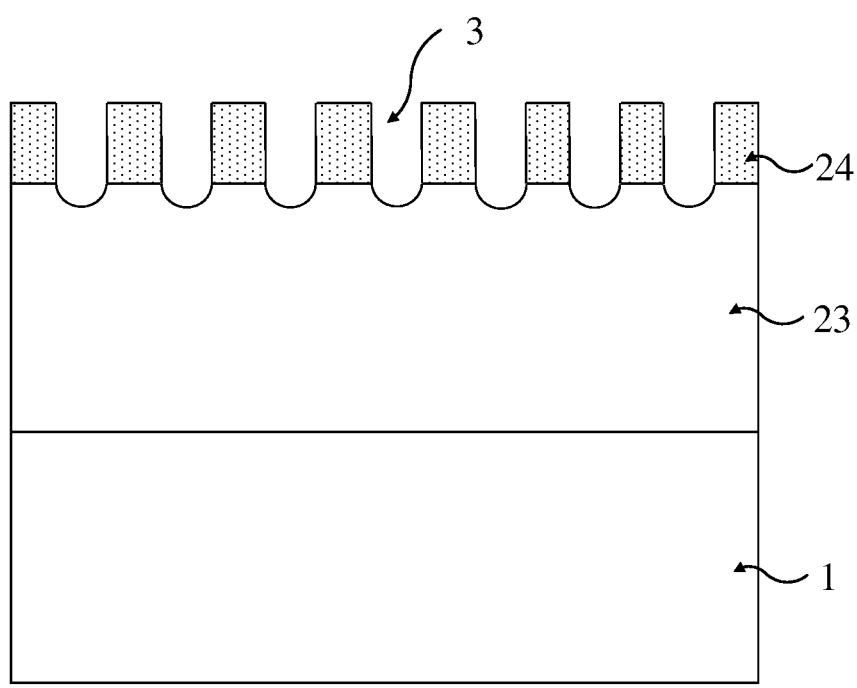

In the embodiment shown in FIGS. 2b and 2c, the cross-sectional shapes of the trench 3 along the B-B section line and the A-A section line shown in FIG. 2a are rectangular, respectively, but which are not particularly limited in the present application. As shown in FIGS. 4a and 4b, the shape of the trench 3 viewing from top to bottom may be determined according to specific design requirements.

Figure 2D:
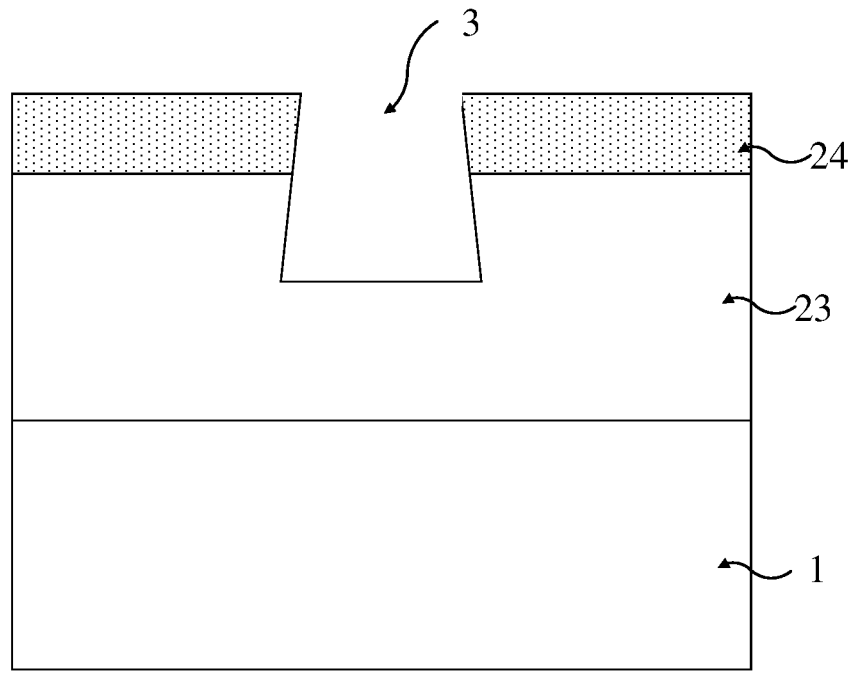
Figure 2E:
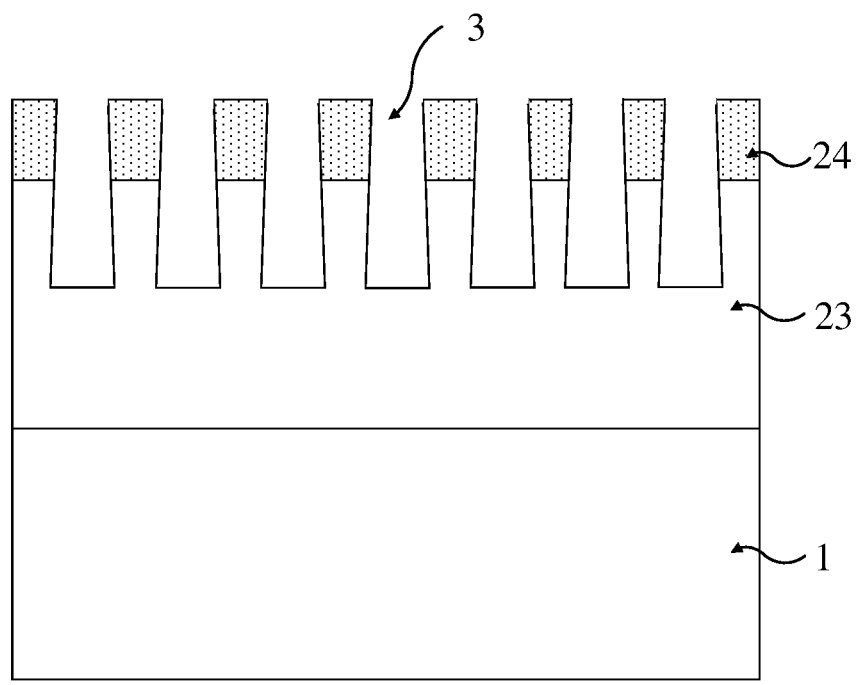

In the embodiment shown in FIGS. 2b and 2c, sidewalls of the trench 3 are perpendicular to an upper surface of the barrier layer 24, but which are not particularly limited in the present application. In other embodiments, as shown in FIGS. 2d and 2e, the sidewalls of the trench 3 are not perpendicular to the upper surface of the barrier layer 24, and an angle between a sidewall of the trench 3 and the upper surface of the barrier layer 24 may be adjusted according to design requirements.

Figure 5A:
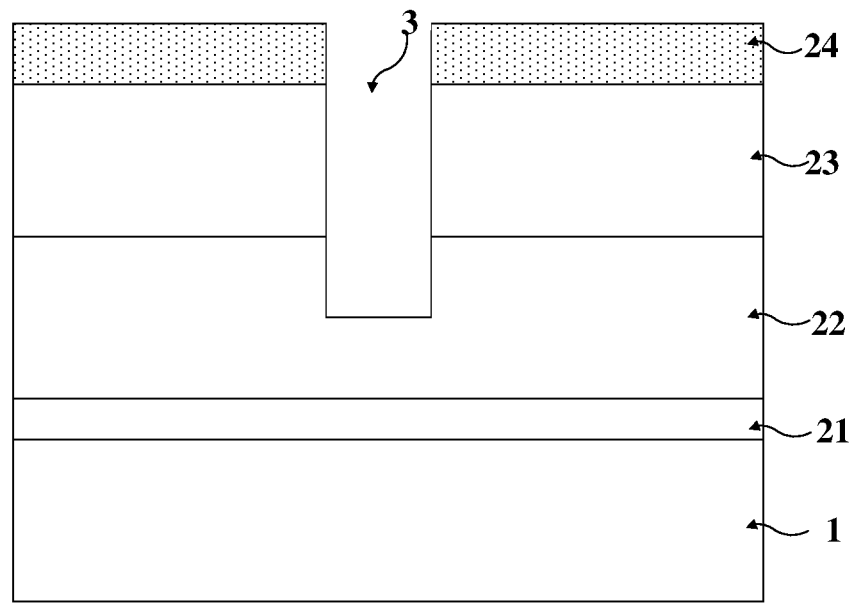
Figure 5B:
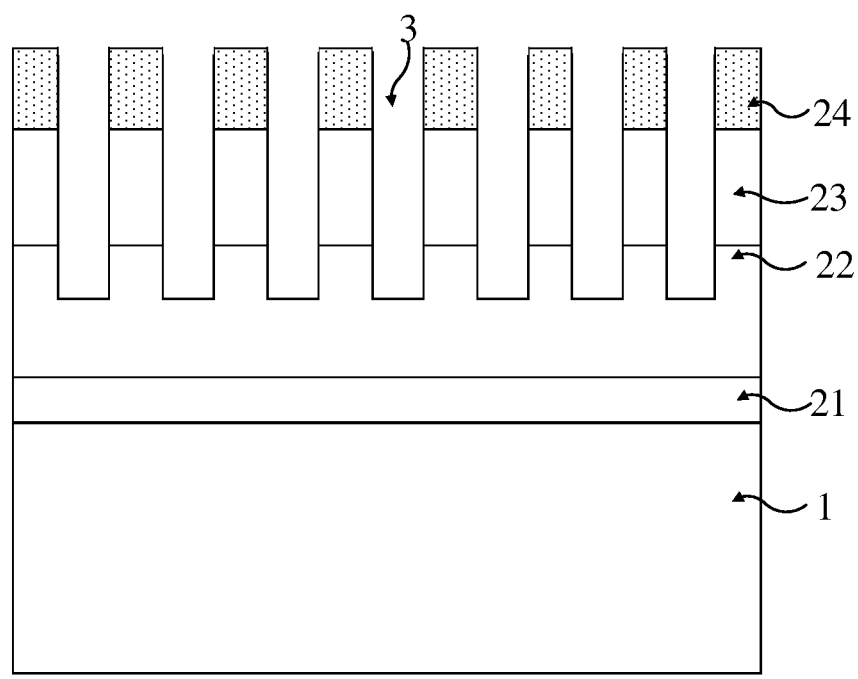

A depth of the trench 3 is shown in FIGS. 2a-2c, and the trench 3 extends into the channel layer 3. In other embodiments, as shown in FIGS. 5a and 5b, FIG. 5a corresponds to FIG. 2b, and FIG. 5b corresponds to FIG. 2c. When a buffer layer is provided, the trench 3 may also extend into the buffer layer 22. Of course, according to design requirements, the trench 3 may not extend into the buffer layer 22.

In the embodiment of the present application in FIGS. 2a-2c, the trenches 3 are evenly arranged in the gate region. The trench 3 may be formed by an etching process such as chlorine-based plasma etching. Of course, the width and spacing of the trench 3 are not strictly limited in the present application. The width and spacing of the trench 3 may be determined according to design requirements, and the two-dimensional electron gas may be depleted by cooperating the P-type semiconductor material 4 described below.

In the embodiment of FIGS. 2a-2c of the present application, the number of trenches 3 is 7. However, the present application is not limited thereto. The number of trenches 3 may be determined according to design requirements, and may be more or less, and the two-dimensional electron gas may be depleted by cooperating the depth, width, spacing of trench 3 and the P-type semiconductor material 4 described below.

Step 103: the trench 3 is filled with a P-type semiconductor material 4.

Figure 6A:
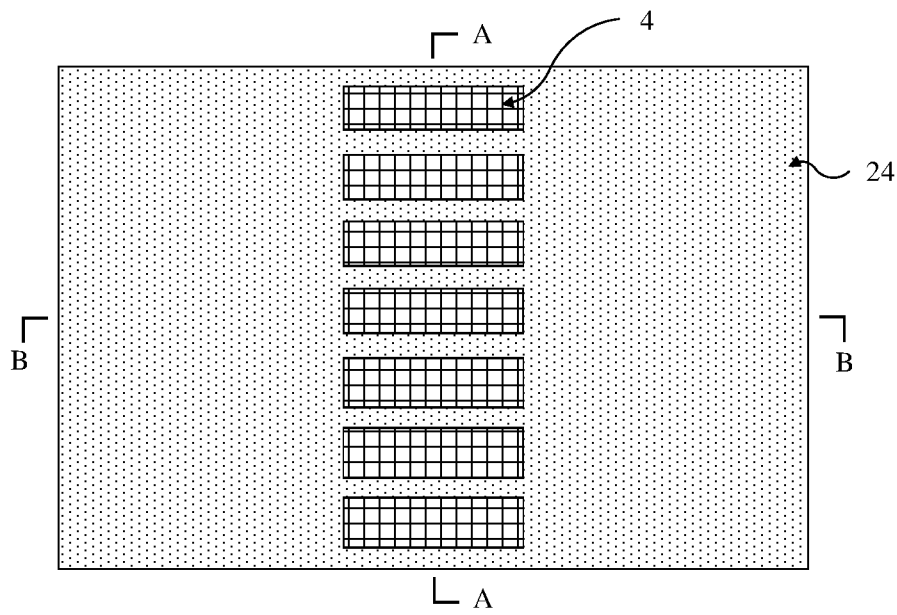
Figure 6B:
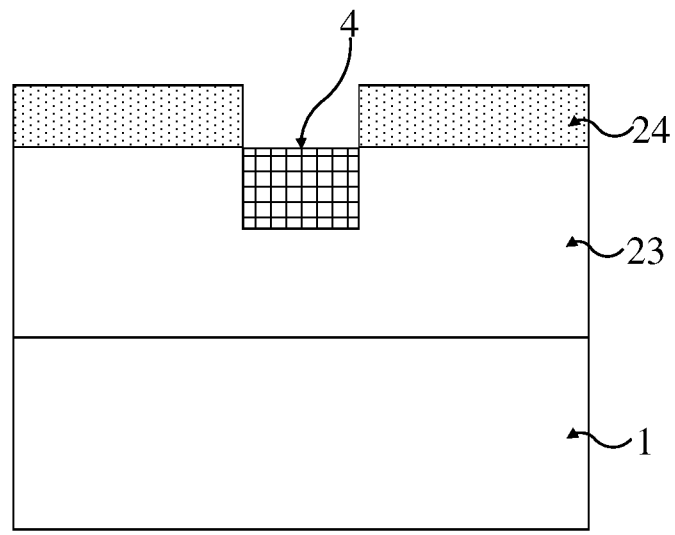
Figure 6C:
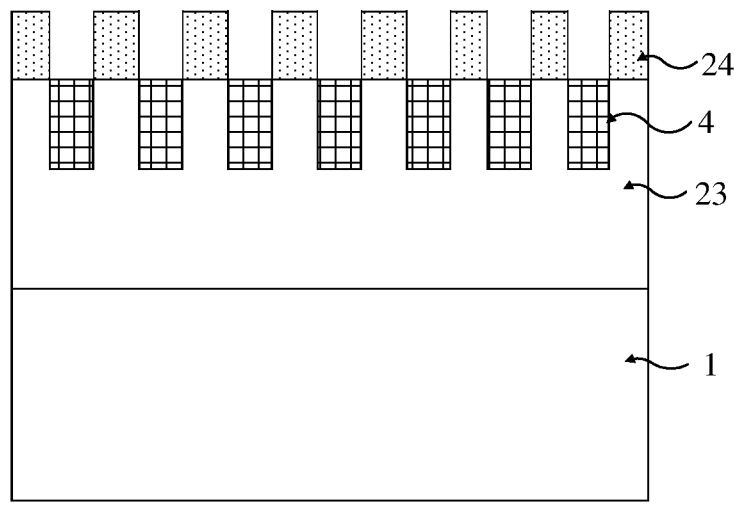

As shown in FIGS. 6a-6c, FIG. 6a is a top view of FIGS. 6b and 6c, FIG. 6b is a cross-sectional view of FIG. 6a along the B-B section line, and FIG. 6c is a cross-sectional view of FIG. 6a along the A-A section line.

The P-type semiconductor material 4 may be, for example, P-type GaN, P-type InGaN, or the like.

Figure 6D:
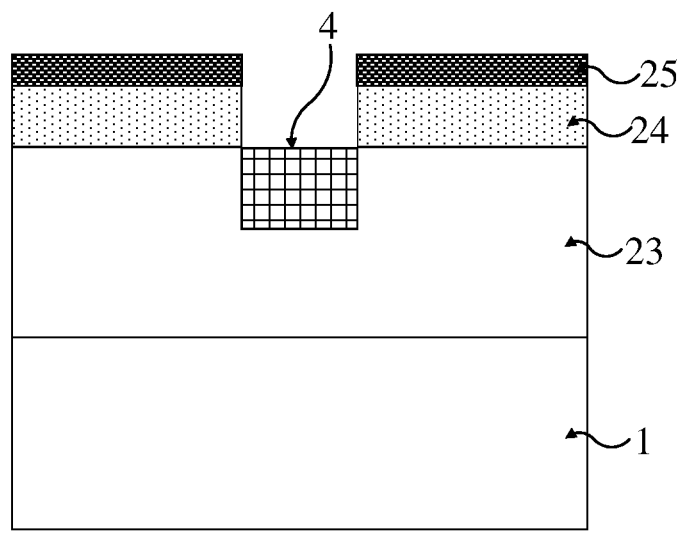
Figure 6E:
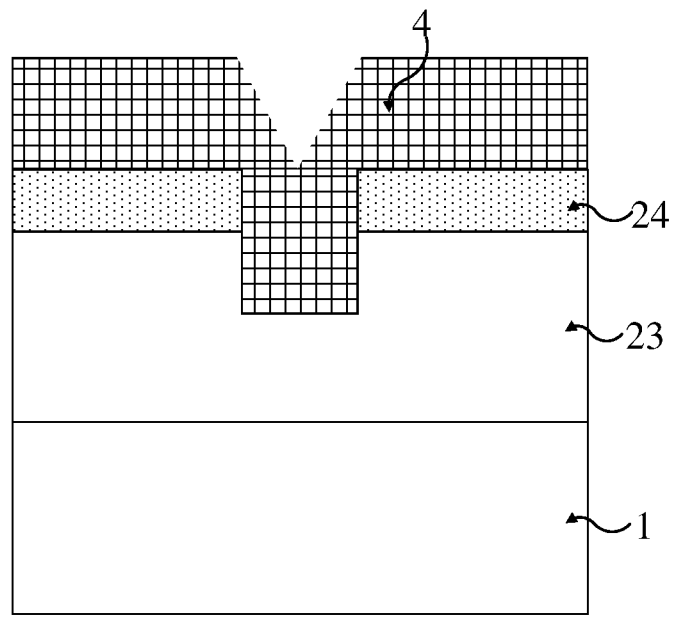

The filling of the trench 3 with the stress applying material 4 may be specifically achieved by directly filling the trench 3 in a selective filling manner, for example. As shown in FIG. 6d, which corresponds to FIG. 6b, a protective layer 25 may be prepared on the barrier layer 24 first, and then the trench 3 may be directly filled with the P-type semiconductor material 4. The protective layer 25 may be specifically, for example, SiN or $SiO_2$ or a combination thereof. The filling of the trench 3 with the P-type semiconductor material 4 may be specifically achieved, for example, by selectively etching a full-wafer growth stress applying material 4. As shown in FIG. 6e, the stress applying material 4 is first grown on a full wafer, for example, the stress applying material 4 is first grown in the trenches 3 and on the upper surface of the barrier layer 24, and then selectively etched to form the structure shown in FIG. 6b.

Figure 7A:
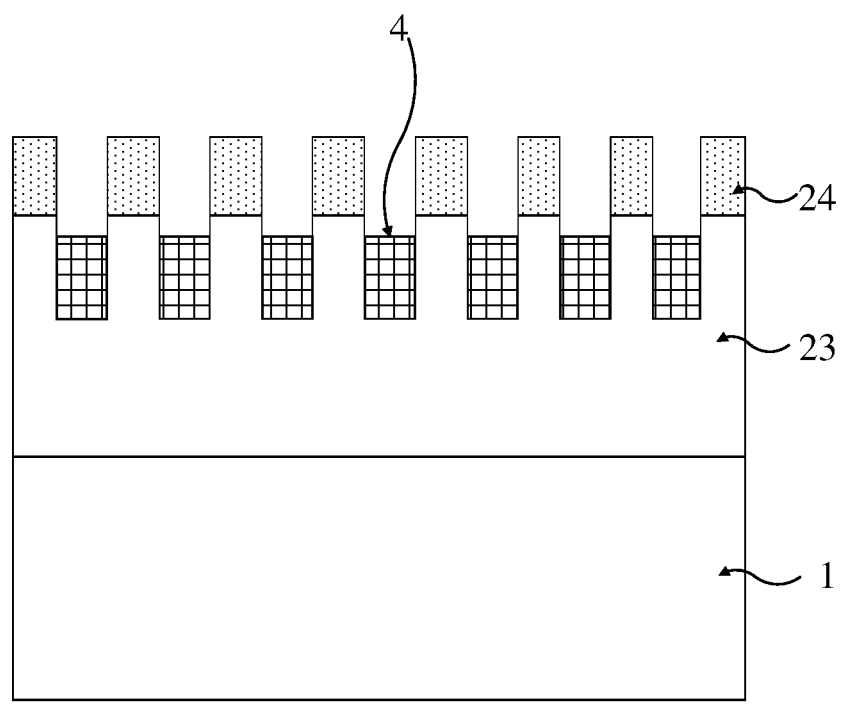
Figure 7B:
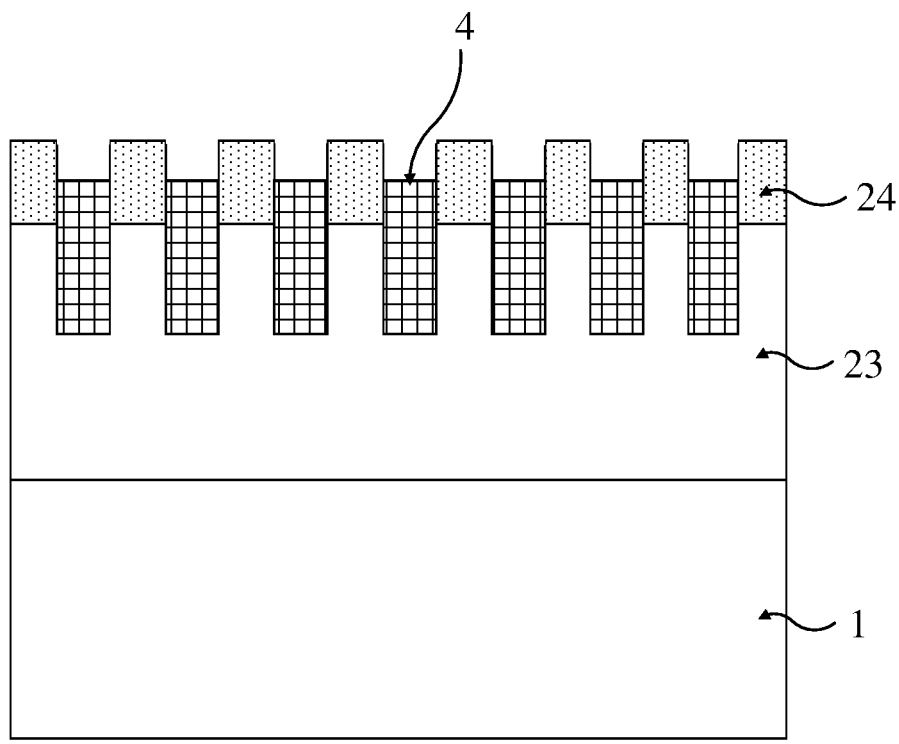
Figure 7C:
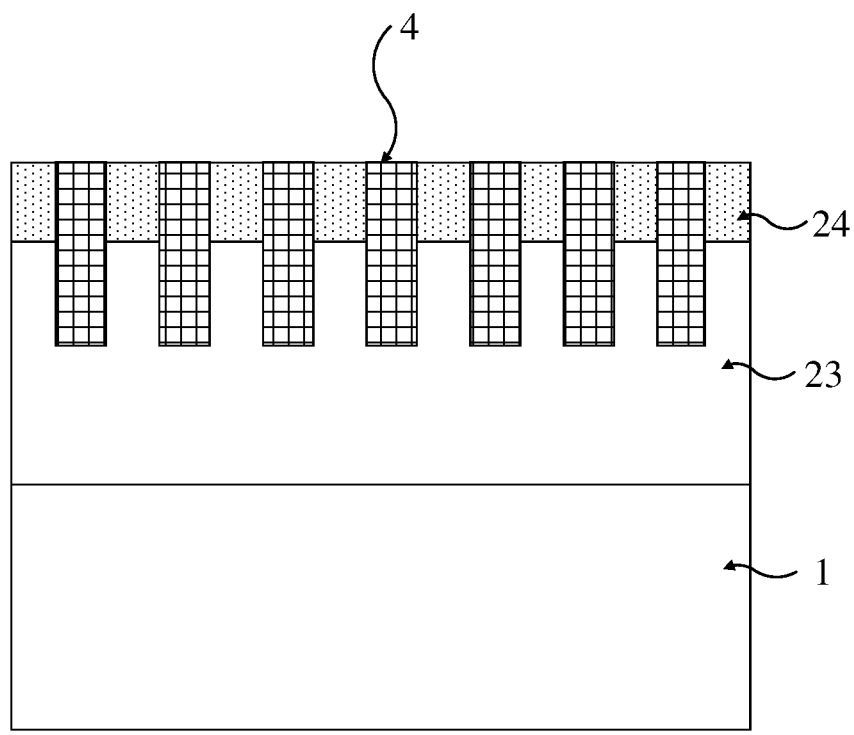
Figure 7D:
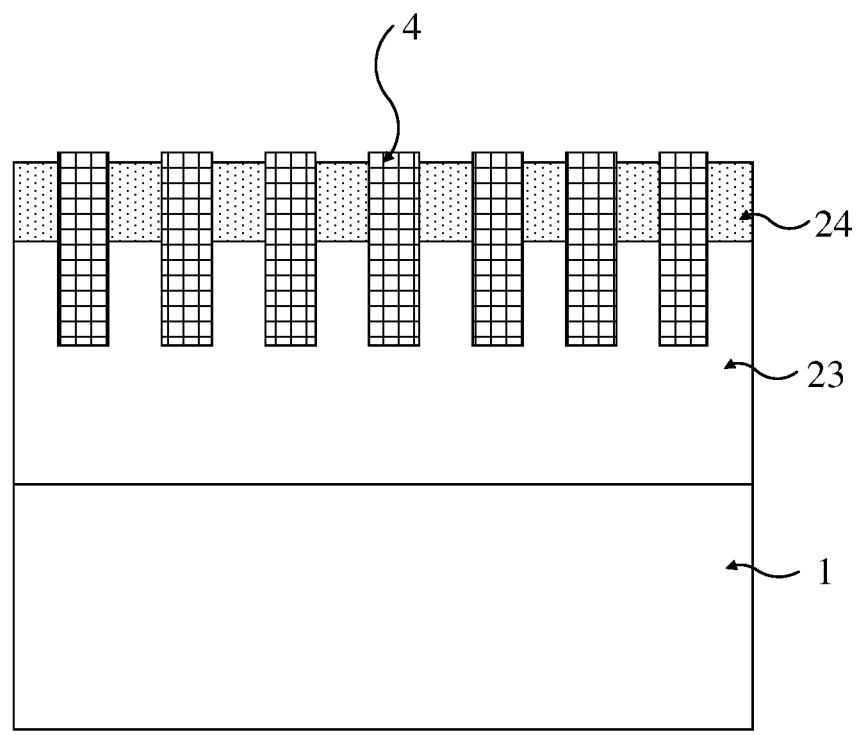

In FIG. 6c, the P-type semiconductor material 4 may fill a part of the trench 3 corresponding to the channel layer 23. It should be understood that the filling depth of the P-type semiconductor material 4 in the trench 3 may be adjusted according to actual application scenarios. As shown in FIGS. 7a-7c, FIGS. 7a-7c correspond to FIG. 6c, and the difference is only that the filling depth of the P-type semiconductor material 4 in the trench 3 is different. As shown in FIG. 7*a*, the P-type semiconductor material 4 may only partially fill a part of the trench 3 corresponding to the channel layer 23; or as shown in FIG. 7*b*, the P-type semiconductor material 4 may fill the part of the trench 3 corresponding to the channel layer 23, while partially filling a part of the trench 3 corresponding to the barrier layer 24; or as shown in FIG. 7*c*, the P-type semiconductor material 4 may fill the part of the trench 3 corresponding to the channel layer 23, while filling a part of the trench 3 corresponding to the barrier layer 24. Since it is difficult to control the stress applying material 4 to fill the part of the trench 3 corresponding to the channel layer 23 and the barrier layer 24, an upper surface of the stress applying material 4 may also be slightly higher than an upper surface of the barrier layer 24, as shown in FIG. 7*d*.

Step 104: a dielectric layer 5 is prepared above the barrier layer 24.

Figure 8A:
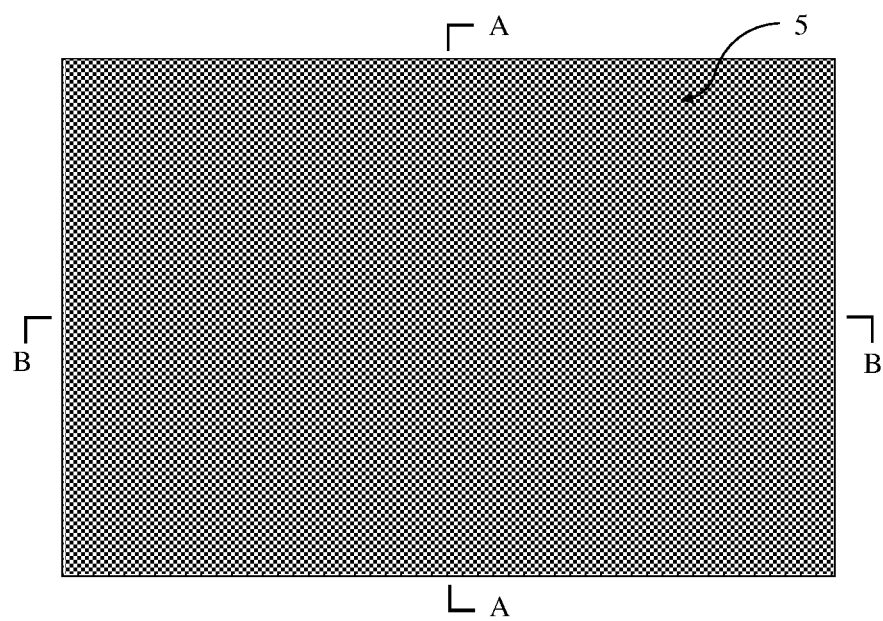
Figure 8B:
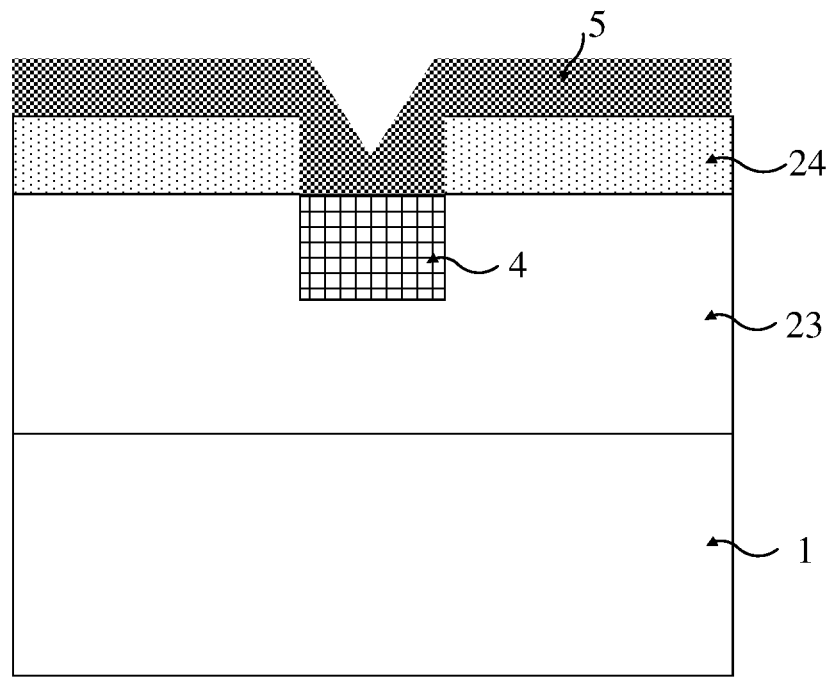
Figure 8C:
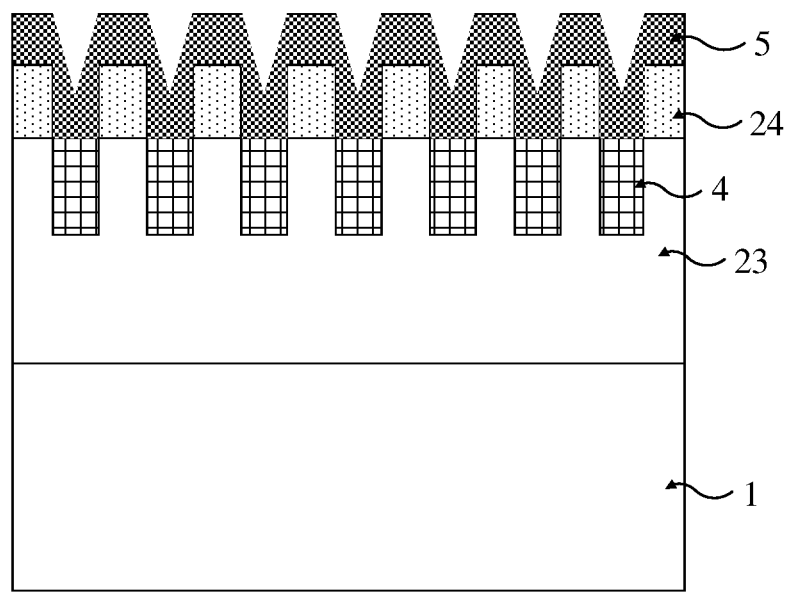

As shown in FIGS. 8*a*-8*c*, FIG. 8*a* is a top view of FIGS. 8*b* and 8*c*, FIG. 8*b* is a cross-sectional view of FIG. 8*a* along the B-B section line, and FIG. 8*c* is a cross-sectional view of FIG. 8*a* along the A-A section line.

The material of the dielectric layer 5 may include one or a combination of following materials: SiO$_2$ and SiN.

Figure 9A:
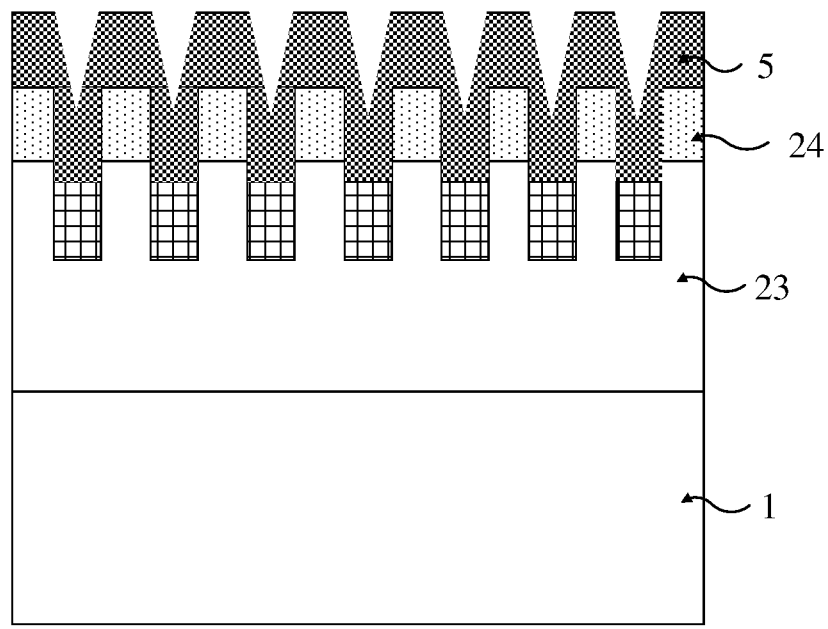
Figure 9B:
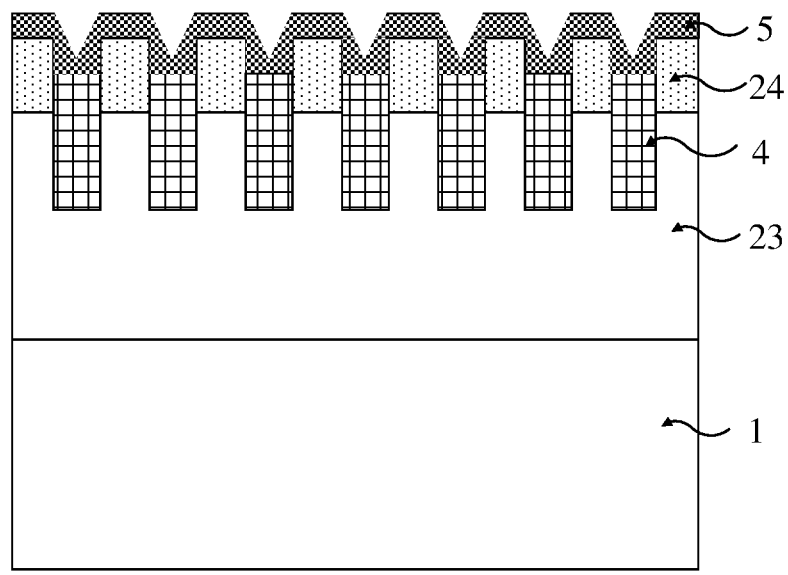
Figure 9C:
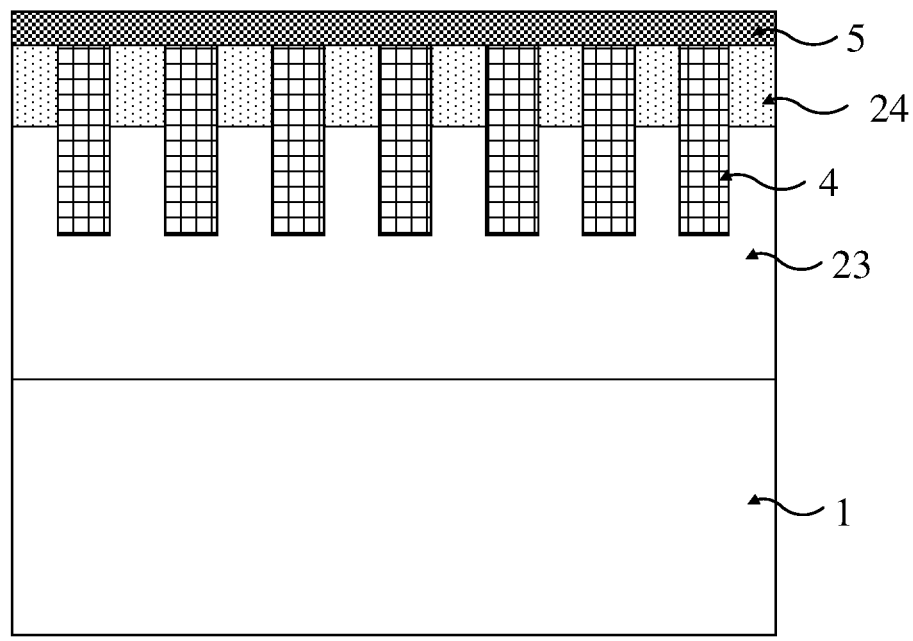

In FIG. 8*c*, the P-type semiconductor material 4 only fills the part of the trench 3 corresponding to the channel layer 23. The specific form of the dielectric layer 5 depends on the filling of the trench 3 with the P-type semiconductor material 4. As shown in FIGS. 9*a*-9*c*, FIGS. 9*a*-9*c* correspond to FIG. 8*c*. The difference between FIGS. 9*a*-9*c* and FIG. 8*c* is that as the filling depth of the P-type semiconductor material 4 in the trench 3 changes, the morphology of the dielectric layer 5 also changes.

Figure 10A:
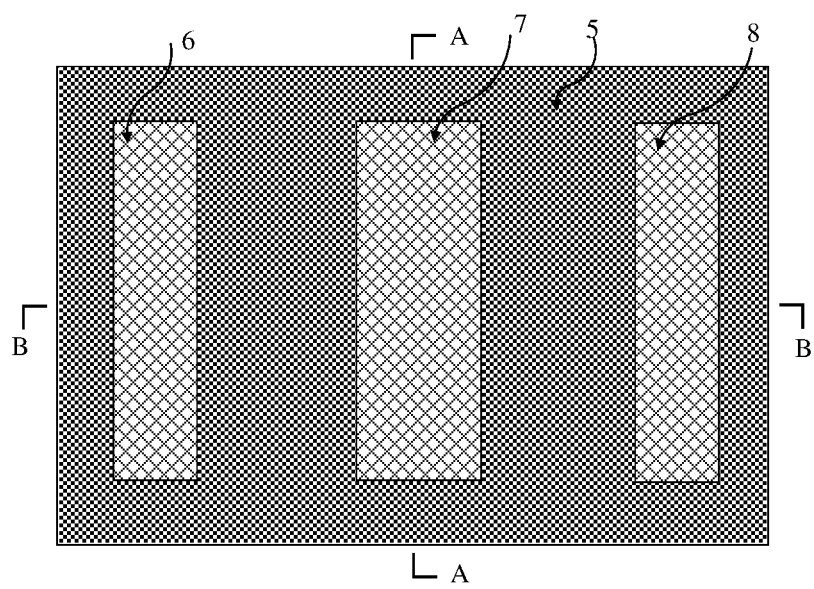
Figure 10B:
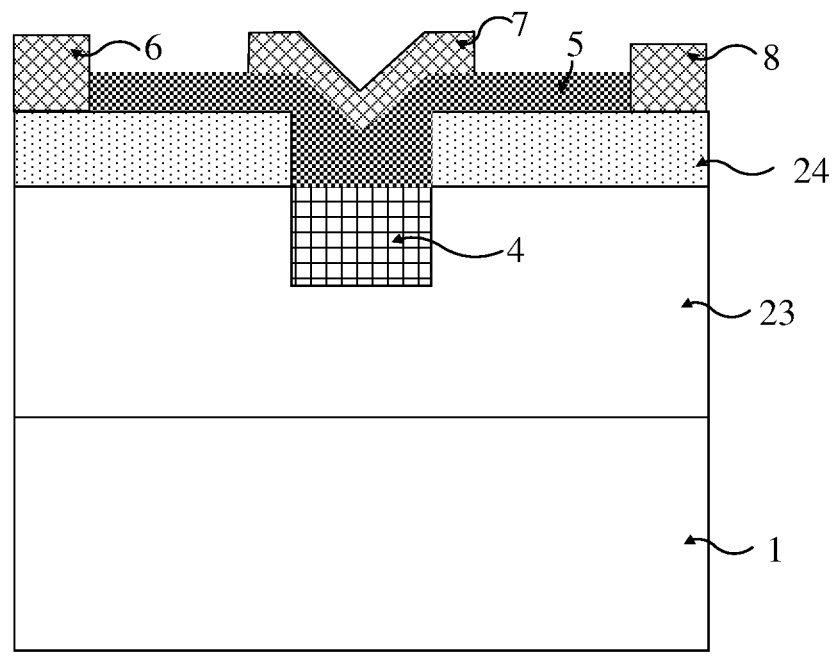
Figure 10C:
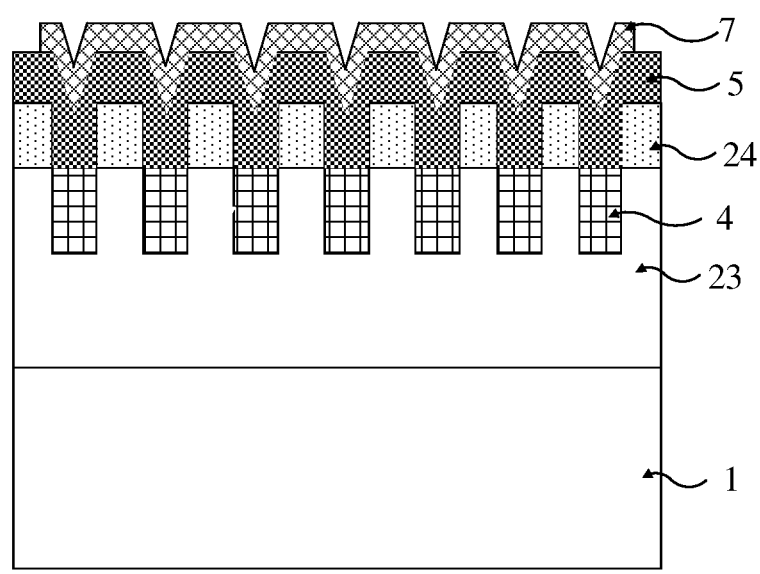

Step 105: as shown in FIGS. 10*a*-10*c*, FIG. 10*a* is a top view of FIGS. 10*b* and 10*c*, FIG. 10*b* is a cross-sectional view of FIG. 10*a* along the B-B section line, and FIG. 10*c* is a cross-sectional view of FIG. 10*a* along the A-A section line. A gate electrode 7 is prepared in a gate region, a source electrode 6 is prepared in a source region, and a drain electrode 8 is prepared in a drain region.

The gate electrode may be directly prepared on the dielectric layer 5; before the source electrode 6 and the drain electrode 8 are prepared, the dielectric layer 5 in the source region and the drain region needs to be etched first, so that the source electrode 6 and the drain electrode 8 form ohmic contact with the barrier layer 24. An electrode material is made of a metal material such as a nickel alloy, and may also be made of a metal oxide or semiconductor material. The electrode material is not limited in the present application.

Figure 11A:
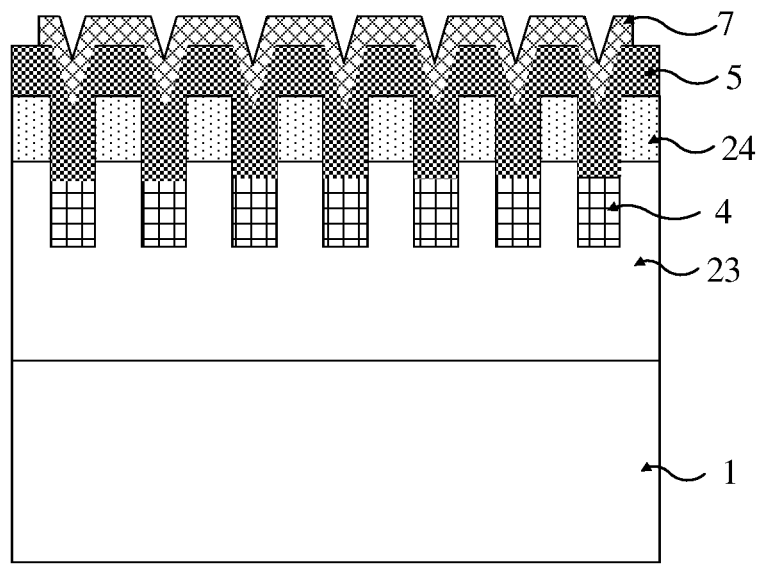
Figure 11B:
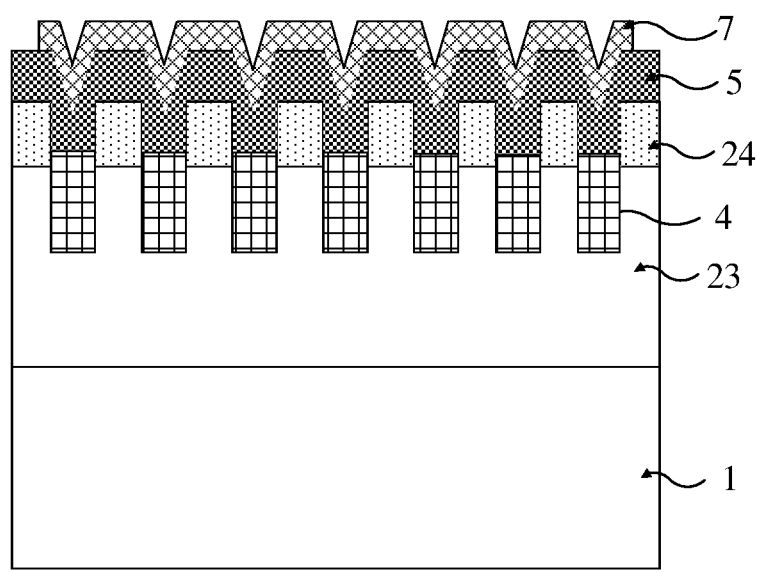
Figure 11C:
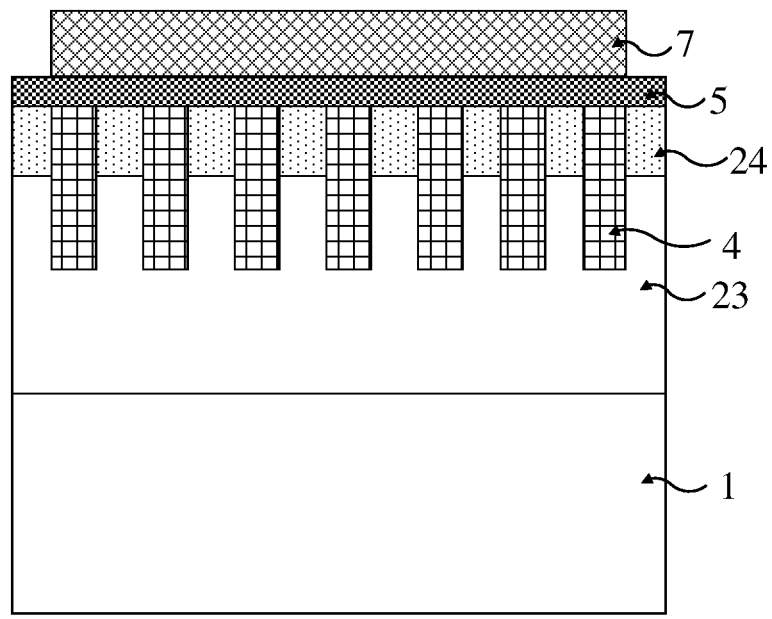

FIGS. 11*a*-11*c* correspond to FIG. 10*c*. The difference between FIGS. 11*a*-11*c* and FIG. 10*c* is that as the filling depth of the P-type semiconductor material 4 in the trench 3 changes, the morphology of the gate electrode 7 also changes.

Figure 12A:
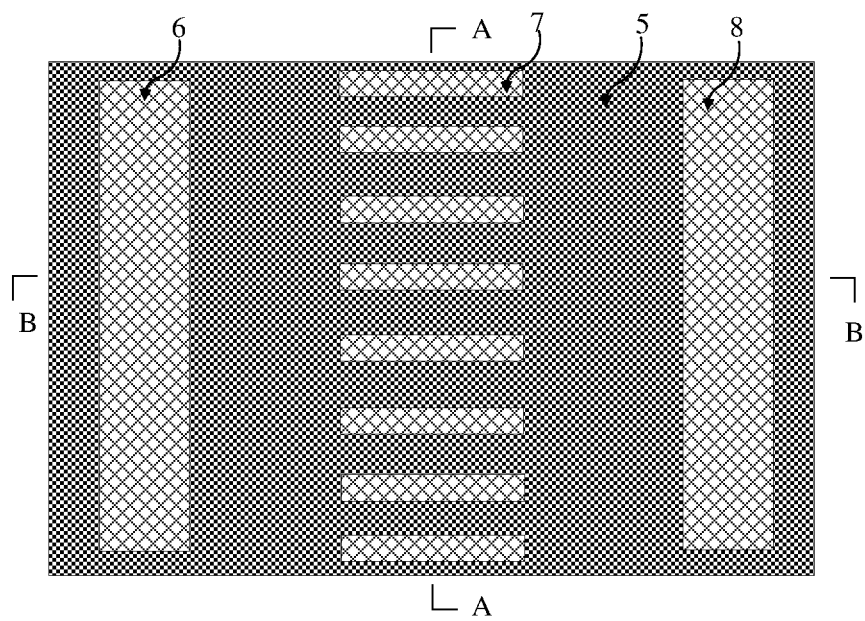
Figure 12B:
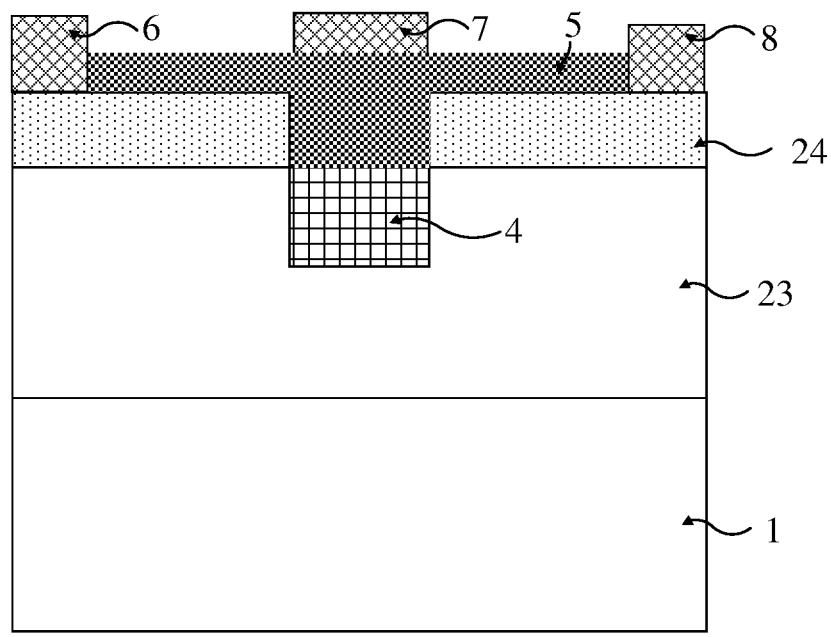
Figure 12C:
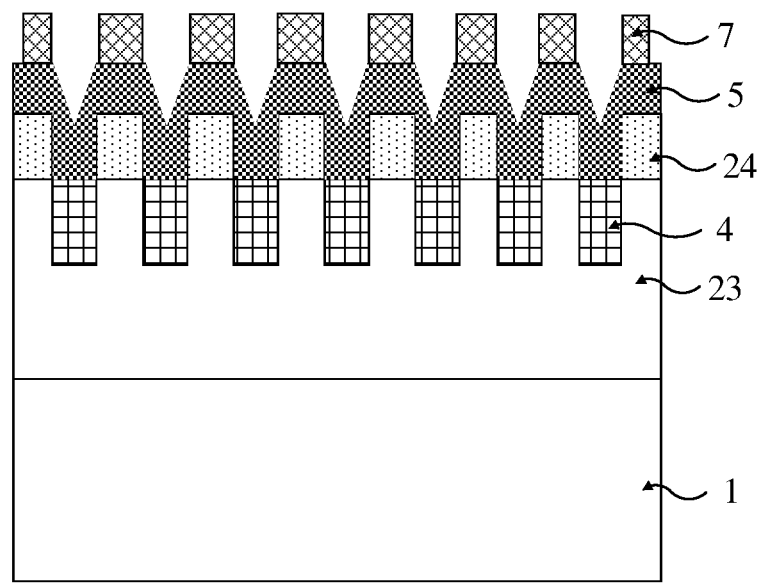

FIGS. 12*a*-12*c* are related to the morphological changes of the gate electrode 7 in another embodiment. FIG. 12*a* is a top view of FIGS. 12*b* and 12*c*, FIG. 12*b* is a cross-sectional view of FIG. 12*a* along the B-B section line, and FIG. 12*c* is a cross-sectional view of FIG. 12*a* along the A-A section line. The difference between FIG. 12*c* and FIG. 10*c* is that a position corresponding to the trench 3 is not provided with a gate electrode.

Figure 12D:
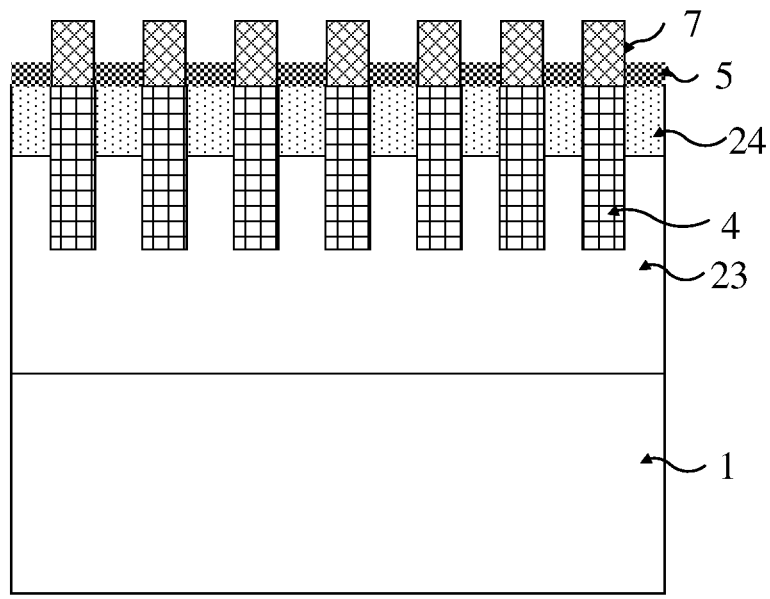

In an embodiment of the present application, as shown in FIG. 12*d*, the gate may also be directly disposed on the P-type semiconductor material 4.

Figure 13A:
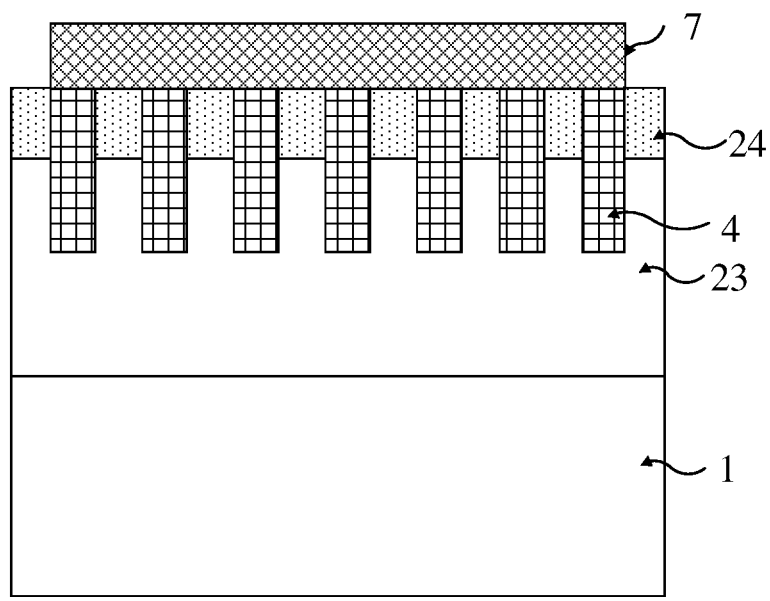
Figure 13B:
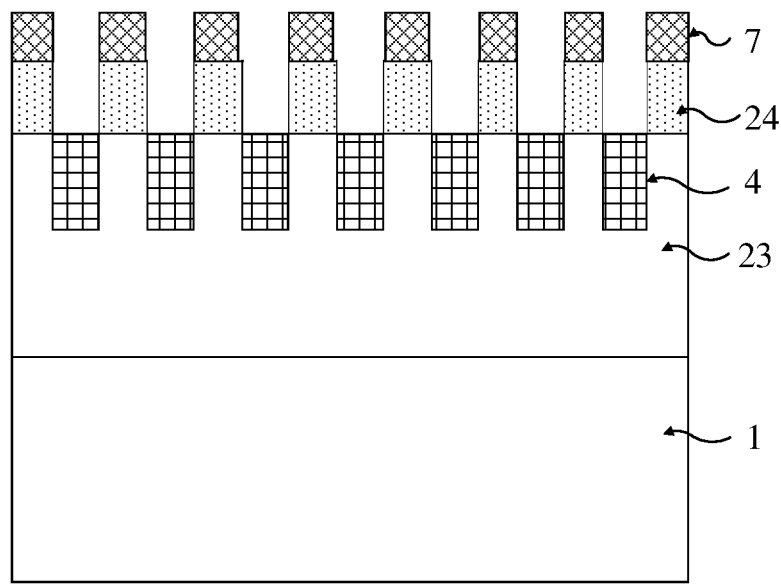
Figure 13C:
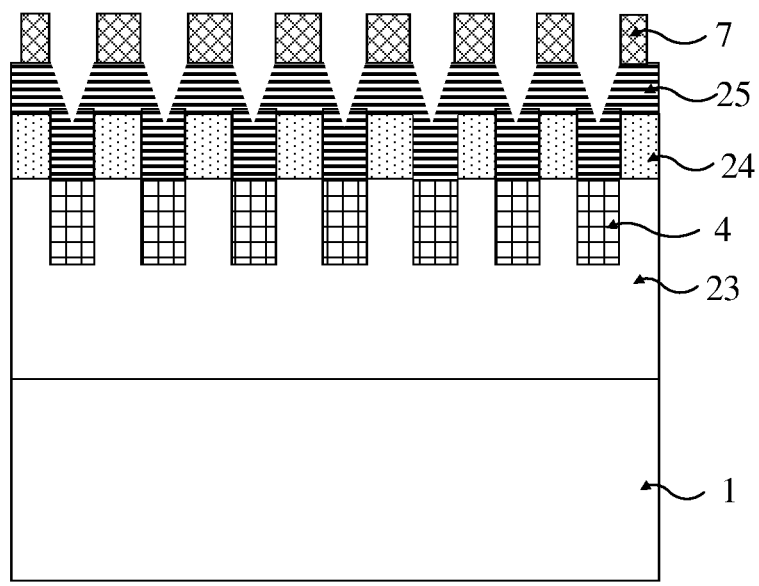
Figure 13D:
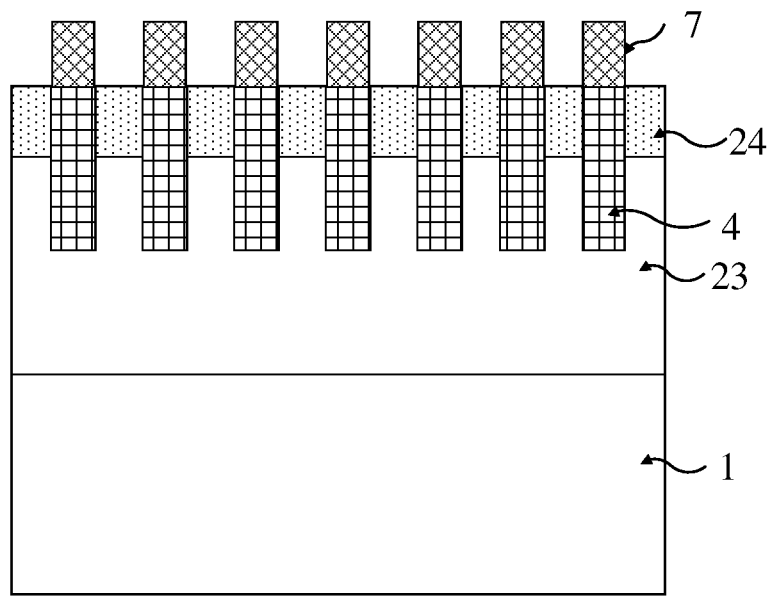

In an embodiment of the present application, step 104: preparing a dielectric layer 5 above the barrier layer 24, which can be omitted. As shown in FIG. 13*a*, the gate electrode 7 is prepared directly above the barrier layer 24. As shown in FIG. 13*b*, the gate electrode may only be provided on the barrier layer 24. Or as shown in FIG. 13*c*, when the filling depth of the P-type semiconductor 4 is relatively shallow, a cap layer 25 may be first prepared on the barrier layer 24, and then the gate electrode 7 is prepared. The cap layer 25 may be formed of a GaN-based semiconductor material. As shown in FIG. 13*d*, the gate electrode 7 may be directly prepared on the P-type semiconductor 4.

In an embodiment of the present application, a semiconductor structure is also provided. As shown in FIG. 1*a*, the semiconductor structure includes: a channel layer 23 and a barrier layer 24 superimposed in sequence on a substrate 1.

The substrate 1 may be selected from semiconductor materials, ceramic materials, or polymer materials. For example, the substrate 1 is preferably selected from diamond, sapphire, silicon carbide, silicon, lithium niobate, silicon on insulator (SOI), gallium nitride, or aluminum nitride. The channel layer 23 and the barrier layer 24 may be semiconductor materials capable of forming two-dimensional electron gas. For example, taking a GaN-based material as an example, the channel layer 23 may be GaN, and the barrier layer 24 may be AlGaN or GaN. The channel layer 23 and the barrier layer 24 constitute a heterostructure to form a two-dimensional electron gas.

In a further embodiment of the present application, in order to improve device performance and meet related technical requirements, as shown in FIG. 1*b*, the semiconductor structure may further include a nucleation layer 21 and a buffer layer 22 disposed under the channel layer 23. Taking a GaN-based semiconductor structure as an example, in order to reduce dislocation density and defect density, and improve crystal quality and other technical requirements, a nucleation layer 21 prepared on the substrate 1 may be further included. The nucleation layer 21 may be one or more of AlN, AlGaN, and GaN. In addition, in order to buffer the stress in an epitaxial structure above the substrate and prevent the epitaxial structure from cracking, the GaN-based semiconductor structure may further include a buffer layer 22 prepared above the nucleation layer 21. The buffer layer 22 may include one or more of GaN, AlGaN, and AlInGaN.

In an embodiment of the present application, as shown in FIGS. 2*a*-2*c*, the semiconductor structure further includes a plurality of trenches 3 formed in a gate region.

The trenches 3 extend into the channel layer 23. As shown in FIGS. 5*a*-5*b*, when the buffer layer 22 is provided, the trench 3 also extends into the buffer layer 22.

In an embodiment of the present application, as shown in FIGS. 6*a*-6*c*, the semiconductor structure further includes a P-type semiconductor material 4 filling the plurality of trenches 3.

In an embodiment of the present application, the material of the channel layer 23 may include GaN, the material of the barrier layer 24 may include AlGaN, and the material of the P-type semiconductor material 4 may include P-type GaN or P-type InGaN.

In an embodiment of the present application, as shown in FIGS. 8*a*-8*c*, the semiconductor structure may further include a dielectric layer 5, and the dielectric layer 5 is covered with a layer on the surface of the barrier layer. The material of the dielectric layer 5 may include one or a combination of the following materials: SiO$_2$ and SiN.

In an embodiment of the present application, as shown in FIGS. 10*a*-10*c*, the semiconductor structure may further include a gate electrode 7 located in a gate region, a source electrode 6 located in a source region, and a drain electrode 8 located in a drain region.

The electrode material is made of a metal material such as a nickel alloy, and may also be made of a metal oxide or semiconductor material. The electrode material is not limited in the present application.

It should be understood that although this specification is described according to embodiments, not each embodiment only includes one independent technical solution. The way of describing is only for clarity purpose, and those skilled in the art should deem the specification as a whole. The technical solutions in each embodiment may also be appropriately combined to form other embodiments that may be understood by those skilled in the art.

The series of detailed descriptions listed above are only specific descriptions of feasible embodiments of the present application. They are not intended to limit the protection scope of the present application. Any equivalent embodiments or modifications made within the technical spirit of the present application shall be included in the protection scope of the present application.

What is claimed is:

1. A semiconductor structure, comprising:
   a channel layer and a barrier layer superimposed in sequence;
   a plurality of trenches formed in a gate region of the barrier layer, wherein the plurality of trenches extend into the channel layer; and
   a P-type semiconductor material filling the plurality of trenches,
   wherein the channel layer and the barrier layer are sequentially stacked on a substrate,
   wherein a sidewall of each trench in the plurality of trenches is an inclined surface, and in a direction from the substrate to the barrier layer, an opening size of the trench gradually decreases,
   wherein the semiconductor structure further comprises:
   a gate electrode located in a gate region above the barrier layer, a source electrode located in a source region above the barrier layer and a drain electrode located in a drain region above the barrier layer,
   wherein a projection of the gate electrode on the channel layer and a projection of the P-type semiconductor material on the channel layer are interleaved.

2. The semiconductor structure according to claim 1, wherein a material of the channel layer comprises GaN, and a material of the barrier layer comprises AlGaN.

3. The semiconductor structure according to claim 1, wherein the P-type semiconductor material comprises P-type GaN or P-type InGaN.

4. The semiconductor structure according to claim 1, further comprising:
   a dielectric layer superimposed on a surface of the barrier layer, wherein the dielectric layer covers the barrier layer.

5. The semiconductor structure according to claim 4, wherein a material of the dielectric layer comprises one or a combination of following materials: $SiO_2$ and SiN.

6. The semiconductor structure according to claim 1, further comprising: a nucleation layer and a buffer layer, located between the substrate and the channel layer.

7. The semiconductor structure according to claim 1, wherein the plurality of trenches are evenly arranged in the gate region.

8. The semiconductor structure according to claim 1, wherein the P-type semiconductor material partially fills a part of each of the plurality of trenches corresponding to the channel layer.

9. The semiconductor structure according to claim 1, wherein the P-type semiconductor material fills a part of each of the plurality of trenches corresponding to the channel layer.

10. The semiconductor structure according to claim 1, wherein the P-type semiconductor material fills a part of each of the plurality of trenches corresponding to the channel layer, and partially fills a part of each of the plurality of trenches corresponding to the barrier layer.

11. The semiconductor structure according to claim 1, wherein the P-type semiconductor material fills a part of each of the plurality of trenches corresponding to the channel layer, and fills a part of each of the plurality of trenches corresponding to the barrier layer.

12. The semiconductor structure according to claim 1, wherein an upper surface of the P-type semiconductor material is higher than an upper surface of the barrier layer.

13. The semiconductor structure according to claim 1, wherein an orthographic projection of the gate electrode on the substrate is located outside an orthographic projection of the trench on the substrate.

14. The semiconductor structure according to claim 1, further comprising:
    a dielectric layer superimposed on a surface of the barrier layer, wherein the dielectric layer covers the barrier layer and is in direct contact with the barrier layer, an upper surface of the P-type semiconductor material is higher than an upper surface of the barrier layer, and a material of the dielectric layer comprises one or a combination of following materials: $SiO_2$ and SiN.

15. The semiconductor structure according to claim 1, wherein in the direction from the substrate to the barrier layer, a distance between two sidewalls of the trench in a first cross-section of the semiconductor structure decreases, and a distance between two sidewalls of the trench in a second cross-section of the semiconductor structure decreases, wherein the first cross-section is perpendicular to an upper surface of the barrier layer, the second cross-section is perpendicular to the upper surface of the barrier layer, and the second cross-section is perpendicular to the first cross-section.

16. The semiconductor structure according to claim 1, wherein the semiconductor structure further comprises a buffer layer located between the substrate and the channel layer, and the plurality of trenches penetrate through the barrier layer and the channel layer and extend into the buffer layer.

17. A method for manufacturing a semiconductor structure, comprising:
    preparing a channel layer and a barrier layer superimposed in sequence;
    preparing a plurality of trenches extending into the channel layer in a gate region of the barrier layer; and
    filling the plurality of trenches with a P-type semiconductor material respectively,
    wherein the channel layer and the barrier layer are sequentially stacked on a substrate,
    wherein a sidewall of each trench in the plurality of trenches is an inclined surface, and in a direction from the substrate to the barrier layer, an opening size of the trench gradually decreases,
    wherein the method for manufacturing a semiconductor structure further comprises:

preparing a gate electrode in a gate region above the barrier layer, a source electrode in a source region above the barrier layer and a drain electrode in a drain region above the barrier layer, wherein a projection of the gate electrode on the channel layer and a projection of the P-type semiconductor material on the channel layer are interleaved.

18. The method for manufacturing a semiconductor structure according to claim 17, further comprising:

preparing a dielectric layer on a surface of the barrier layer, wherein the dielectric layer covers the barrier layer.

19. The method for manufacturing a semiconductor structure according to claim 17, further comprising:

growing a nucleation layer and a buffer layer between the substrate and the channel layer.

20. The method for manufacturing a semiconductor structure according to claim 17, further comprising:

growing a buffer layer between the substrate and the channel layer, wherein the buffer layer, the channel layer and the barrier layer are sequentially stacked on the substrate, and the plurality of trenches penetrate through the barrier layer and the channel layer and extend into the buffer layer.

* * * * *